(12) United States Patent
Stahle et al.

(10) Patent No.: US 8,093,094 B2
(45) Date of Patent: Jan. 10, 2012

(54) BLOCKING CONTACTS FOR N-TYPE CADMIUM ZINC TELLURIDE

(75) Inventors: Carl M. Stahle, Severna Park, MD (US); Bradford H. Parker, Columbia, MD (US); Sachidananda R. Babu, Greenbelt, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 881 days.

(21) Appl. No.: 12/137,844

(22) Filed: Jun. 12, 2008

(65) Prior Publication Data

US 2009/0311860 A1 Dec. 17, 2009

(51) Int. Cl.
*H01L 21/00* (2006.01)
(52) U.S. Cl. ............ 438/92; 438/93; 257/E21.075; 257/E21.068; 257/E21.476
(58) Field of Classification Search ............ 438/93, 438/92; 257/E21.476, E21.068, E21.075
See application file for complete search history.

(56) References Cited

U.S. PATENT DOCUMENTS

| | | | | |
|---|---|---|---|---|
| 4,853,078 A * | 8/1989 | Miyazaki | | 117/82 |
| 5,969,359 A * | 10/1999 | Ruddy et al. | | 250/370.05 |
| 6,299,680 B1 * | 10/2001 | Koyama et al. | | 117/2 |
| 6,803,322 B1 * | 10/2004 | Polichar et al. | | 438/745 |
| 7,064,082 B2 * | 6/2006 | Polichar et al. | | 438/745 |
| 7,312,458 B2 * | 12/2007 | Blevis | | 250/370.09 |
| 7,462,833 B2 * | 12/2008 | Chen et al. | | 250/370.01 |
| 7,728,304 B2 * | 6/2010 | Chen et al. | | 250/370.13 |
| 2009/0311860 A1 * | 12/2009 | Stahle et al. | | 438/686 |
| 2010/0012188 A1 * | 1/2010 | Garnett | | 136/260 |
| 2010/0015753 A1 * | 1/2010 | Garnett | | 438/84 |

OTHER PUBLICATIONS

M.E. Ozsan et al., "CdZnTe Schottky Diodes for Radiation Spectroscopy", Dec. 2002, IEEE Xplore, p. 2276-2280.*
H. Chen et al., "Low-temperature photoluminescence of detector grade CdZnTe crystal treated by different chemical etchants", Sep. 1996, American Institute of Physics, p. 3509-3512.*
A.A. Rouse et al., "Interfacial Chemistry and the Performance of Bromine-etched CdZnTe Radiation Detector Devices", Dec. 2002, IEEE Xplore, p. 2459-2463.*
Park et al., "Influence of Surface Treatment of CdZnTe for Radiation Detector", Mar. 2005, IEEE Nuclear Science Symposium Conference Record, p. 1399-1401.*
Li et al., "Metal-CdZnTe contact and its annealing behaviors", Jan. 2006, Applied Surface Science 253 (2006), p. 1190-1193.*
Bolotnikov et al., "Effects of Bulk and Surface Conductivity on the Performance of CdZnTe Pixel Detectors", Aug. 2002, vol. 49, No. 4, p. 1941-1949.*
Chu et al., "Tellurium antisites in CdZnTe", Oct. 2001, Applied Physics Letters, vol. 79, No. 17, p. 2728-2730.*
Miles et al., Emission Tomgraphy: The Fundamentals of PET and Spectrospcopy, Chapter 15: "CdTe and CdZnTe Semiconductor Detectors for Nuclear Medicine Imaging", by D. Wagenaar, Academic Press, Dec. 2004, p. 269-291.*

* cited by examiner

*Primary Examiner* — Evan Pert
(74) *Attorney, Agent, or Firm* — Christopher O. Edwards

(57) ABSTRACT

A process for applying blocking contacts on an n-type CdZnTe specimen includes cleaning the CdZnTe specimen; etching the CdZnTe specimen; chemically surface treating the CdZnTe specimen; and depositing blocking metal on at least one of a cathode surface and an anode surface of the CdZnTe specimen.

19 Claims, 1 Drawing Sheet

BLOCKING CONTACTS FOR N-TYPE CADMIUM ZINC TELLURIDE

ORIGIN OF INVENTION

The invention described herein was made by employees of the United States Government, and may be manufactured and used by or for the Government for governmental purposes without the payment of any royalties thereon or therefore.

BACKGROUND OF THE INVENTION

The invention relates in general to x-ray or gamma ray detectors and in particular to blocking contacts on such detectors.

Cadmium Zinc Telluride (CdZnTe) has gained acceptance as a semiconductor detector material for x-ray and gamma ray applications ranging from astronomy to medical imaging. One challenge remaining for this technology is the production of large volume (greater than 4 cubic centimeters) detectors free of bulk defects (grain and twin boundaries), which are detrimental to detector performance. CdZnTe can be produced by several different Bridgman furnace configurations, for example High Pressure Bridgman (HPB) or Modified Horizontal Bridgman (MHB).

The HPB process produces slightly p-type CdZnTe with a very high bulk resistivity ($10^{11}$ Ohm-cm) and, therefore, these detectors have low leakage current noise and good spectral performance. Unfortunately, HPB CdZnTe has a high density of bulk defects that results in a poor yield and high cost for large volume detectors. The MHB growth process produces n-type CdZnTe with a much lower density of bulk defects. However, the material has a relatively low bulk resistivity ($5 \times 10^9$ Ohm-cm) and, therefore, conventional ohmic contacts yield much higher leakage current noise resulting in a poor spectral resolution. To take advantage of the lower density of bulk defects in MHB CdZnTe, there is a need for contacts having low leakage current noise.

SUMMARY OF THE INVENTION

It is an object of the invention to provide a process of making blocking contacts on n-type CdZnTe.

One aspect of the invention is a process for applying blocking contacts on an n-type CdZnTe specimen comprising cleaning the CdZnTe specimen; etching the CdZnTe specimen; chemically surface treating the CdZnTe specimen; and depositing blocking metal on at least one of a cathode surface and an anode surface of the CdZnTe specimen.

The step of chemically surface treating may include etching in sodium hypochlorite. The sodium hypochlorite may be about a 1% sodium hypochlorite solution. The step of etching in sodium hypochlorite may be performed for about 30 seconds.

The step of chemically surface treating may include rinsing in methanol after etching in sodium hypochlorite. The step of rinsing in methanol may be performed for about one minute. The step of chemically surface treating may include the step of drying after rinsing in methanol.

The step of depositing blocking metal on at least one of the cathode surface and the anode surface may include depositing platinum. The step of depositing blocking metal on at least one of the cathode surface and the anode surface may include depositing blocking metal at a rate of about one angstrom per second. The step of depositing blocking metal on at least one of the cathode surface and the anode surface may include depositing blocking metal to a total thickness of about 800 angstroms.

The step of etching the CdZnTe specimen may include etching in a bromine in methanol solution. The bromine in methanol solution may be about 1% bromine in methanol solution. The step of etching the CdZnTe specimen may include rinsing the CdZnTe solution in a methanol bath after etching in the bromine in methanol solution. The step of rinsing may include rinsing the CdZnTe specimen in first and second methanol baths.

The step of cleaning may include agitating the CdZnTe specimen in acetone. The step of cleaning may include agitating the CdZnTe specimen in methanol after agitating in acetone. The step of cleaning may include agitating the CdZnTe specimen in de-ionized water after agitating in methanol. The step of cleaning may include examining the CdZnTe specimen under magnification.

The process may further comprise the step of providing a polished CdZnTe specimen before the step of cleaning the CdZnTe specimen.

Further objects, features and advantages of the invention will become apparent from the following detailed description taken in conjunction with the following drawings.

DETAILED DESCRIPTION OF THE PREFERRED EMBODIMENTS

Figure 1:
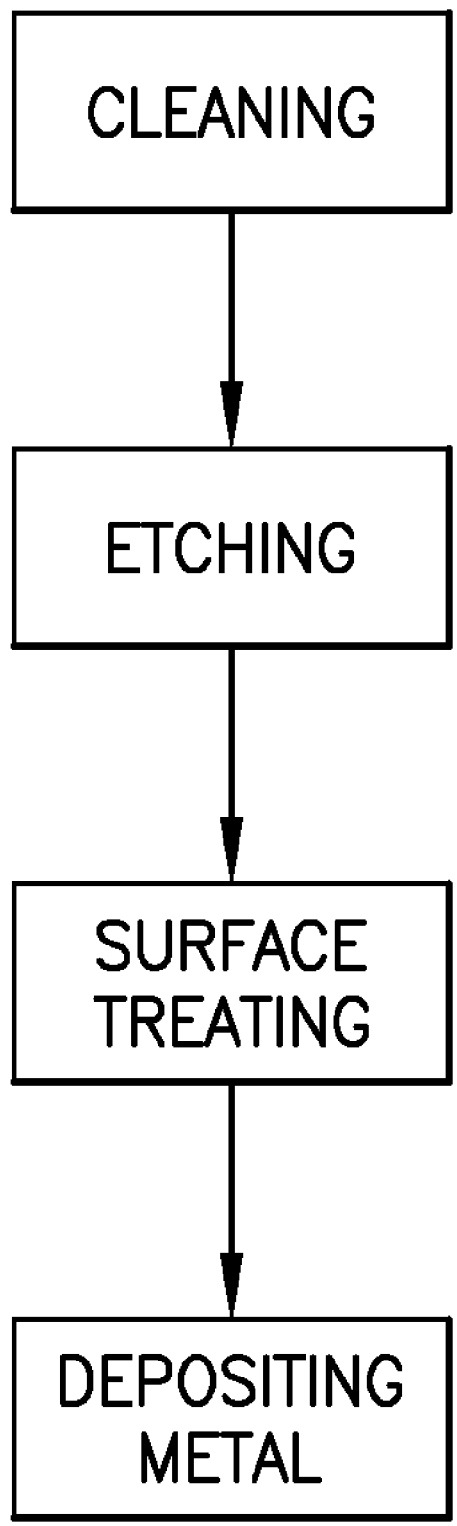
FIG. 1 is a block diagram showing the principal process steps.

The invention includes a process for applying blocking metal contacts on n-type CdZnTe for the purpose of producing x-ray or gamma ray detectors. The process steps include cleaning with conventional solvents, etching in a bromine solution to remove cutting and polishing damage, surface treating with a chemical, and depositing contacts using a shadow mask in combination with electron beam evaporation of the contact metal.

The inventive blocking contacts reduce CdZnTe detector leakage current by a factor of 10 at bias voltages typically used for n-type CdZnTe detectors with ohmic contacts (approximately 120 Volts per millimeter of thickness). The reduced leakage current noise produces improved spectral resolution. In addition, the reduced leakage current noise allows for the application of higher bias voltages (approximately 200 Volts per millimeter of thickness) thereby promoting full charge collection and further improving spectral resolution.

In one embodiment of the invention, the blocking Platinum (Pt) contacts are applied to n-type CdZnTe. The detectors produced in this embodiment have Pt contacts on both the detector cathode and anode and both contacts are produced using the same process. Pt was selected because of its high work function (5.65 eV) and its demonstrated good adhesion to CdZnTe. The CdZnTe specimens used in the process are supplied with polished surfaces so that further polishing is not needed. The cathode and anode patterns are produced using a shadow mask so that photolithography is not required.

The process uses two fixtures designed for alignment of the shadow masks relative to the specimen. There are separate shadow masks for the planar cathode and the pixellated anode. The specimen is aligned within each fixture. Pre-aligning the specimen in the cathode fixture minimizes the time the CdZnTe is exposed to the open laboratory environment after the final surface chemical treatment and before contact deposition. Likewise, having a separate pre-aligned anode mask fixture minimizes the time that the CdZnTe is exposed to the open laboratory environment between the cathode and anode deposition process steps.

FIG. 1 is a block diagram showing the principal process steps of cleaning, etching, surface treating and depositing metal.

CLEANING. For all cleaning steps, the CdZnTe specimen is held in a clean Teflon basket and only handled using clean Teflon tweezers. The solvent baths can be ultrasonically agitated, or the operator can agitate by hand using the basket. Fresh baths are ideal. Specimen cleanliness is critical to the process. An exemplary series of cleaning steps are:
1. Acetone, five minutes.
2. Methanol, five minutes.
3. De-ionized water, five minutes.
4. Blow dry using dry nitrogen.
5. Examine specimen under 10 to 20× magnification to insure cleanliness.
6. If necessary, repeat cleanings steps 1-4.
7. Examine specimen under 10 to 20× magnification to insure cleanliness.
8. If necessary, use acetone damped swabs to aid in cleaning and then follow with cleaning steps 1-4.
9. Examine specimen under 10 to 20× magnification to insure cleanliness.

ETCHING. The bromine etching solution must be prepared just prior to the etching process. Again, the CdZnTe specimen should be held in a Teflon basket or holder that allows the etching solution to freely contact the entire cathode and anode surfaces of the specimen. The specimen should be in continuous motion during the entire etching time. An exemplary series of etching steps are:
1. Etch in 1% Bromine in Methanol solution for four minutes.
2. Rinse in first Methanol bath, 10 seconds.
3. Rinse in second Methanol bath, 1 minute.
4. Blow dry using dry nitrogen.

SURFACE CHEMICAL TREATMENT. The purpose of the surface chemical treatment is to restore the surface stoichiometry of the CdZnTe, because the bromine etching produces a cadmium rich surface. An exemplary series of surface chemical treatment steps are:
1. Etch in 1% sodium hypochlorite solution for 30 seconds.
2. Rinse in Methanol, 1 minute.
3. Blow dry using dry nitrogen.
4. Transfer specimen to pre-aligned cathode shadow mask fixture.

CONTACT DEPOSITION. The deposition is performed using an electron beam evaporator. The CdZnTe specimen needs to be loaded into the deposition chamber as quickly as possible after the surface chemical treatment step to minimize exposure to the laboratory atmosphere. A tungsten crucible is used for the platinum deposition. Platinum pellets need to be pre-melted in the crucible prior to being used for a contact deposition. Preferably, the platinum crucible is dedicated to this process only. That is, the crucible is not used for other different laboratory deposition processes thereby helping to insure a repeatable deposition rate at the start of the deposition process. The cathode deposition is preferably performed first. An exemplary series of contact deposition steps are:
1. Load specimen fixture in evaporator and pump down chamber to less than $1\times10^{-6}$ torr.
2. Perform cathode platinum deposition at 1 angstrom per second, total thickness 800 angstroms.
3. Break vacuum and quickly transfer specimen to pre-aligned anode fixture.
4. Load specimen fixture in evaporator and pump down chamber to less than $1\times10^{-6}$ torr.
5. Perform anode platinum deposition at 1 angstrom per second, total thickness 800 angstroms.

The deposition of the platinum metal contact can also be done by a sputtering vacuum deposition process.

One novel feature of the process is the surface chemical treatment that restores the surface stoichiometry of the CdZnTe after bromine etching. This processing step dramatically enhances the blocking nature of the platinum contacts. The improved platinum blocking contacts on n-type CdZnTe result in an order of magnitude or more reduction in leakage current noise thereby directly improving the spectral resolution. For example, a typical CdZnTe pixellated detector suitable for medical imaging (5 mm thick with a 2.46 mm pixel pitch) having ohmic contacts has a resolution of 7.5% at 60 keV whereas the same exact detector configuration with blocking contacts has a spectral resolution of 4.5% at 60 keV.

An additional benefit of the low leakage current produced by the blocking contacts is compatibility with newer generation application specific integrated circuits being designed for CdZnTe detector applications. Many of these new low power ASICs require low leakage current pixels.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. A process for applying blocking contacts on an n-type CdZnTe specimen, comprising:
   cleaning the CdZnTe specimen;
   etching the CdZnTe specimen;
   chemically surface treating the CdZnTe specimen; and
   depositing blocking metal on at least one of a cathode surface and an anode surface of the CdZnTe specimen;
   wherein the step of chemically surface treating includes etching in sodium hypochlorite.

2. The process of claim 1 wherein the sodium hypochlorite is about a 1% sodium hypochlorite solution.

3. The process of claim 1 wherein the step of etching in sodium hypochlorite is performed for about 30 seconds.

4. The process of claim 1 wherein the step of chemically surface treating includes rinsing in methanol after etching in sodium hypochlorite.

5. The process of clam 4 wherein the step of rinsing in methanol is performed for about one minute.

6. The process of claim 4 wherein the step of chemically surface treating includes the step of drying after rinsing in methanol.

7. The process of claim 1 wherein the step of depositing blocking metal on at least one of the cathode surface and the anode surface includes depositing platinum.

8. The process of claim 1 wherein the step of depositing blocking metal on at least one of the cathode surface and the anode surface includes depositing blocking metal at a rate of about one angstrom per second.

9. The process of claim 1 wherein the step of depositing blocking metal on at least one of the cathode surface and the anode surface includes depositing blocking metal to a total thickness of about 800 angstroms.

10. The process of claim 1 wherein the step of etching the CdZnTe specimen includes etching in a bromine in methanol solution.

11. The process of claim 10 wherein the bromine in methanol solution is about 1% bromine in methanol solution.

12. The process of claim 10 wherein the etching is performed for about four minutes.

13. The process of claim 10 wherein the step of etching the CdZnTe specimen includes rinsing the CdZnTe solution in a methanol bath after etching in the bromine in methanol solution.

14. The process of claim 13 wherein the step of rinsing includes rinsing the CdZnTe specimen in first and second methanol baths.

15. The process of claim 1 wherein the step of cleaning includes agitating the CdZnTe specimen in acetone.

16. The process of claim 15 wherein the step of cleaning includes agitating the CdZnTe specimen in methanol after agitating in acetone.

17. The process of claim 16 wherein the step of cleaning includes agitating the CdZnTe specimen in de-ionized water after agitating in methanol.

18. The process of claim 15 wherein the step of cleaning includes examining the CdZnTe specimen under magnification.

19. The process of claim 1 further comprising the step of providing a polished CdZnTe specimen before the step of cleaning the CdZnTe specimen.

\* \* \* \* \*